United States Patent
Kushitani et al.

(10) Patent No.: US 6,933,802 B2
(45) Date of Patent: Aug. 23, 2005

(54) HIGH FREQUENCY SWITCH

(75) Inventors: Hiroshi Kushitani, Izumisano (JP); Yasushi Nagata, Kyoto (JP); Takeo Yasuho, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 14 days.

(21) Appl. No.: 10/649,626

(22) Filed: Aug. 28, 2003

(65) Prior Publication Data

US 2004/0061546 A1 Apr. 1, 2004

(30) Foreign Application Priority Data

Sep. 9, 2002 (JP) ........................................ 2002-262415

(51) Int. Cl.⁷ .................................................. H01P 1/15
(52) U.S. Cl. ........................ 333/103; 333/193; 333/262
(58) Field of Search ................................ 333/101, 103, 333/104, 185, 193, 262

(56) References Cited

U.S. PATENT DOCUMENTS 5,990,580 A * 11/1999 Weigand ...................... 307/125
6,788,958 B2 * 9/2004 Furutani et al. .......... 455/552.1

FOREIGN PATENT DOCUMENTS

| JP | 8-97743 | 4/1996 |
| JP | 9-181588 | 7/1997 |

* cited by examiner

*Primary Examiner*—Dean Takaoka
(74) *Attorney, Agent, or Firm*—Wenderoth, Lind & Ponack, L.L.P.

(57) ABSTRACT

A frequency switch is configured with two FET switches. One end of a second FET switch is connected between an I/O port and a reception port and the other end is ground. A strip line is connected between the second FET switch and the I/O port, and has an electrical length equivalent to ¼ wavelength of a high frequency signal input from transmission port.

4 Claims, 5 Drawing Sheets

HIGH FREQUENCY SWITCH

BACKGROUND OF THE INVENTION

1. Field of the Invention

The present invention relates to high frequency switches typically used in the RF circuits of mobile phones.

2. Background Art

A known structure of a high frequency switch used in an RF circuit of high frequency wireless apparatuses such as mobile phones is a PIN diode mounted on a multilayer board with a built-in strip line. (For example, refer to Japanese Laid-open Patent No. H8-97743 (pp. 3–4, FIGS. 1, 2, and 3).)

Greater integration of the high frequency switch and other high frequency components such as high frequency filters and amplifiers disposed around the high frequency switch is being seen. To allow integration, high frequency switches mounted on the multilayer board need to be downsized to secure extra space for mounting other high frequency components. One currently proposed method for downsizing high frequency switches using a PIN diode is the use of a field-effect transistor switch (FET switch) as a high frequency switch. (For example, refer to Japanese Laid-open Patent No. H9-181588 (p. 4, FIG. 1).)

However, if FET switches are employed, each FET switch needs to contain multi-step FETs, such as four-to eight-step FETs, taking into account the withstand voltage of FETs configuring the FET switch for high frequency signals input from a transmission port. This hinders sufficient downsizing of the high frequency switch and blocks integration.

SUMMARY OF THE INVENTION

The present invention offers a high frequency switch which includes a first FET switch connected between an input/output (I/O) port and a transmission port, a second FET switch whose one end is connected between the I/O port and reception port and the other end is grounded, a control port controlling ON and OFF of the first and second FET switches, and a strip line. The electrical length of the strip line connected between one end of the second FET switch and I/O port is equivalent to ¼ wavelength of the high frequency signal input from the transmission port.

DETAILED DESCRIPTION OF THE INVENTION

Exemplary embodiments of the present invention are described below with reference to the drawings.

First Exemplary Embodiment

Figure 1A:
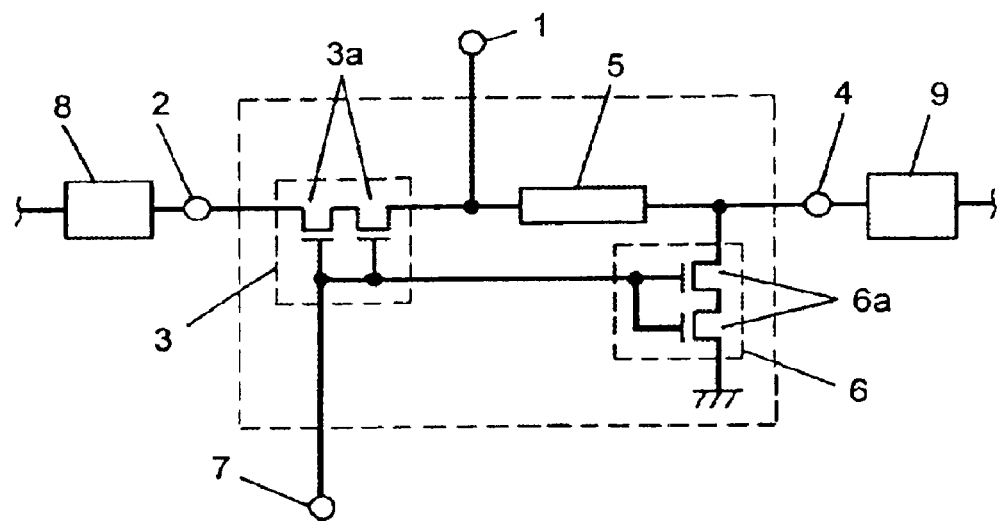
FIGS. 1A, 1B and 1C are equivalent circuit diagrams of a high frequency switch in accordance with a first exemplary embodiment of the present invention.
Figure 1B:
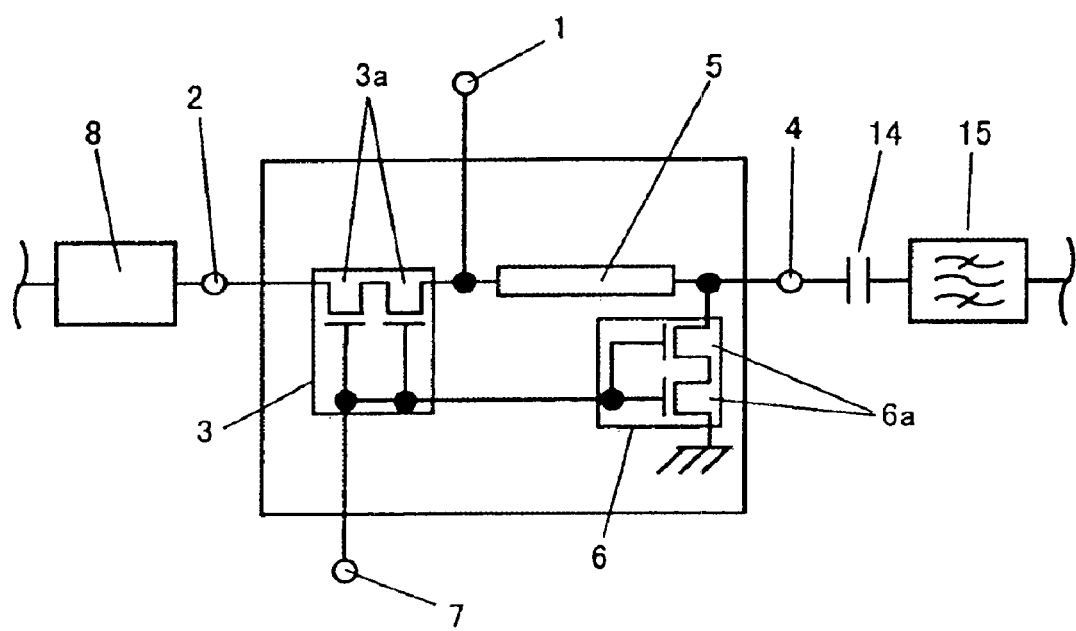
Figure 1C:
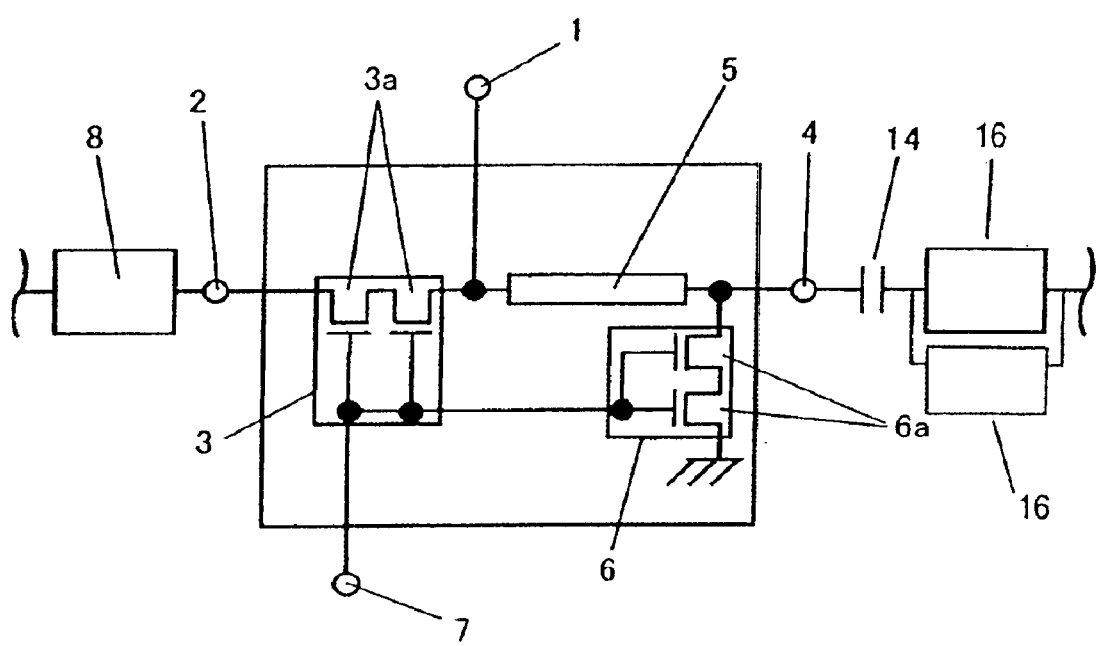

FIGS. 1A through 1C are circuit diagrams of a high frequency switch employed in an RF circuit of a mobile phone. This high frequency switch includes first field-effect transistor switch (FET switch) 3 connected between input/output (I/O) port 1 and transmission port 2, strip line 5 connected between I/O port 1 and reception port 4, second field-effect transistor switch (FET switch) 6 connected between strip line 5 to the side of reception port 4 and a ground, and control port 7 which controls ON and OFF of the above two FET switches 3 and 6.

During transmission, a control voltage is applied from control port 7 to the two FET switches 3 and 6 so as to turn on the two FET switches 3 and 6. The electrical length of strip line 5 is set to about ¼ wavelength of the transmission signal so as to ground strip line 5 via second FET switch 6. This keeps the side of reception port 4, as seen from I/O port 1, open, allowing transmission signals input from transmission port 2 to flow efficiently to I/O port 1.

During receiving, the two FET switches 3 and 6 are turned off by cutting the control voltage applied to these two FET switches 3 and 6. This makes the receiving signal input from I/O port 1 flow efficiently to reception port 4.

Taking into account the withstand voltage of the two FET switches 3 and 6, FET elements 3a and 6a configuring FET switches 3 and 6 need to have multiple steps such as a four-to eight-step structure, since the transmission signal is generally amplified via an amplifier (not illustrated) disposed before transmission port 2. However, FET elements 3a and 6a of the high frequency switch of the present invention require only a two-step structure.

This is achieved by providing strip line 5 inside the high frequency switch. Since a phase shifter becomes high impedance at radio frequencies as a result of configuring the phase shifter with strip line 5, the voltage applied to each of the FET switches 3 and 6 is reduced. Accordingly, the number of steps in FET elements 3a and 6a respectively can be reduced.

The reduced number of steps in FET elements 3a and 6a greatly contributes to integration of the high frequency switch.

Figure 2:
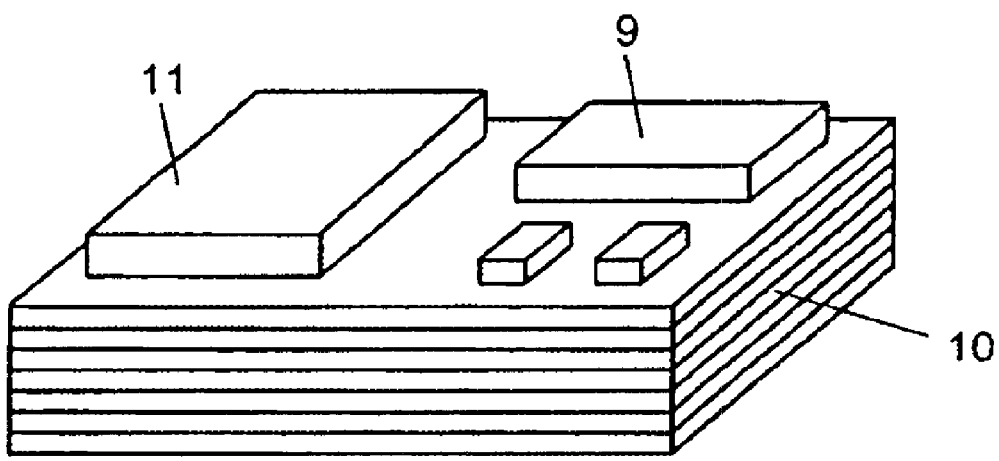
FIG. 2 is a perspective view of the high frequency switch in accordance with the first exemplary embodiment of the present invention.

More specifically, low-pass filter 8 configured with an LC circuit is connected to the side of transmission port 2 of the above high frequency switch, and reception filter 9 is connected to the side of reception port 4. FIG. 2 depicts this configuration. Low-pass filter 8 configured with the LC circuit is formed by an inner layer of dielectric multilayer board 10, and reception filter 9 is mounted on this multilayer board 10. The high frequency switch shown in FIG. 1 is made by integrally forming two FET switches 3 and 6 by semiconductor element 11 and mounting this semiconductor element 11 on the top face of multilayer board 10. Remaining strip line 5 is formed in an inner layer of multilayer board 10. These components are appropriately connected using connection electrodes such as via holes.

The above configuration, in which the high frequency switch is combined with low-pass filter 8 and receiving filter 9, allows further downsizing and a higher degree of integration of other high frequency components by reducing the area required by high frequency components such as reception filter 9 and semiconductor element 11 mounted on the top face of multilayer board 10.

As shown in FIG. 1B, in reception filter.9 connected to reception port 4, a path from reception port 4 to a later step is preferably made of a high frequency filter 15 such as a band pass filter and SAW filter connected by capacitive coupling of a capacitor 14. This is because the capacitive coupling can also be used as a capacitor for cutting the DC component in the control voltage applied from control port 7.

At present, the SAW filter is mainly used as reception filter 9 connected after the high frequency switch circuit.

Accordingly, it is preferable to employ the SAW filter as reception filter 9.

Accordingly, the high frequency switch can be combined.

As shown in FIG. 1C, if the reception filter has a sharing device structure by combining two SAW filters 16, the high frequency signal output from reception port 4 can be further divided, further adding value to the high frequency switch.

The high frequency switch can thus be further combined with other high frequency components.

Second Exemplary Embodiment

The high frequency switch described in the first exemplary embodiment refers to an SPDT-type high frequency switch circuit in which transmission port 2 and reception port 4 are generally switched as required against one I/O port 1.

Figure 3:
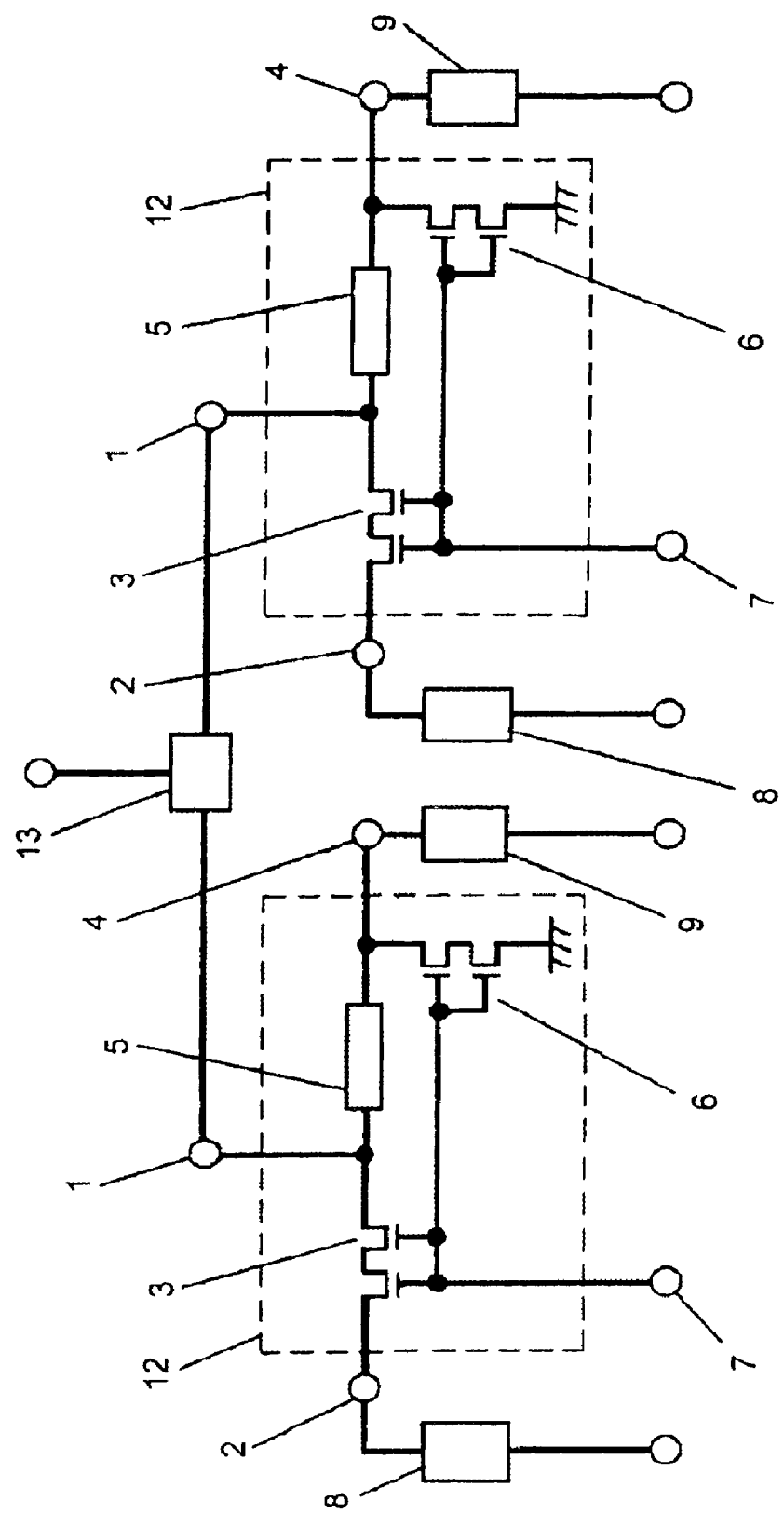
FIG. 3 is an equivalent circuit diagram of a high frequency switch in accordance with a second exemplary embodiment of the present invention.

FIG. 3 is a combined high frequency switch for multiple bands in which two or more types of transmission and receiving signals in different frequency bands are handled by connecting diplexer 13 to an I/O port of two high frequency switches 12. In this case, the circuit configuration becomes more complex, and FET switches 3 and 6 and other chip components such as capacitors and inductors need to be densely mounted on the top face of multilayer board 10. The integration achieved by the present invention, as described, is thus extremely effective for saving mounting space on the top face of multilayer board 10.

In the present invention, a strip line is provided between the second FET switch whose one end is connected between the I/O port and reception port and the other end is grounded, and the I/O port. The voltage applied to the first and second switches is reduced by providing this strip line having an electrical length equivalent to ¼ wavelength of the high frequency signal input to the transmission port. This enables a reduction in the number of steps in each FET switch, and thus the present invention readily enables the downsizing of the high frequency switch, making it suitable for combining with other high frequency components.

What is claimed is:

1. A high frequency switch comprising:

a first FET switch connected between an input and output (I/O) port and a transmission port;

a strip line connected between said I/O port and a reception port, said strip line having an electrical length equivalent to ¼ wavelength of a high frequency signal input from said transmission port;

a second FET switch whose one end is connected to said strip line and to a side of said reception port and the other end is ground; and a control port for controlling turning on and off of said first and second FET switches;

wherein said strip line is formed in an inner layer of a dielectric multilayer board, wherein said first and second FET switches are mounted on a surface of said multilayer board as a high frequency device, and wherein a sharing device made by combining two SAW filters is connected to an end of said reception port, said sharing device being mounted on the surface of said multilayer board.

2. The high frequency switch as defined in claim 1, wherein an LC filter is connected to an end of said transmission port, said LC filter being formed in an inner layer of said multilayer board.

3. The high frequency switch as defined in claim 1, wherein said sharing device provided at the end of said reception port is configured by capacitive coupling.

4. The high frequency switch as defined in claim 3, wherein said sharing device made by combining two SAW filters is a high frequency filter.

* * * * *